United States Patent
Jang et al.

(10) Patent No.: US 7,522,008 B2
(45) Date of Patent: Apr. 21, 2009

(54) INJECTION LOCKER FREQUENCY DIVIDER

(75) Inventors: Sheng-Lyang Jang, Taipei (TW);
Chun-Chieh Chao, Yilan (TW);
Yun-Hsueh Chang, Taoyuan (TW);
Shao-Hwa Lee, Taipei (TW)

(73) Assignee: National Taiwan University of Science & Technology, Taipei (TW)

( * ) Notice: Subject to any disclaimer, the term of this patent is extended or adjusted under 35 U.S.C. 154(b) by 99 days.

(21) Appl. No.: 11/892,195

(22) Filed: Aug. 21, 2007

(65) Prior Publication Data
US 2008/0231379 A1 Sep. 25, 2008

(30) Foreign Application Priority Data
Mar. 22, 2007 (TW) .............................. 96110002 A

(51) Int. Cl.
*H03B 5/24* (2006.01)
*H03K 3/03* (2006.01)

(52) U.S. Cl. ..................... 331/172; 331/57; 327/118

(58) Field of Classification Search .................. 331/57, 331/172–174; 327/115, 117–118
See application file for complete search history.

(56) References Cited

U.S. PATENT DOCUMENTS

2003/0119456 A1* 6/2003 Maligeorgos ................ 455/87

OTHER PUBLICATIONS

Chuang, Y.H., et al.; A Ring-Oscillator-Based Wide Locking Range Frequency Divider; IEEE Microwave and Wireless Components Letters; Aug. 2006; 470-472; vol. 16, No. 8.
Jang, S.L., et al.; Circuit Techniques for CMOS Divide-By-Four Frequency Divider; IEEE Microwave and Wireless Components Letters; Mar. 2007; 217-219; vol. 17, No. 3.

* cited by examiner

*Primary Examiner*—David Mis
(74) *Attorney, Agent, or Firm*—Bacon & Thomas, PLLC

(57) ABSTRACT

An injection locked frequency divider includes a ring oscillator, a first injection unit and a second injection unit. The ring oscillator includes a first delay cell and a second delay cell each including differential input terminals and differential output terminals. The differential input terminals and the differential output terminals of the first delay cell are respectively coupled to the differential output terminals and the differential input terminals of the second delay cell. The first injection unit connected between the differential output terminals of the first delay cell receives and injects a first injection signal to the differential output terminals of the first delay cell. The second injection unit connected between the differential output terminals of the second delay cell receives and injects a second injection signal to the differential output terminals of the second delay cell.

12 Claims, 8 Drawing Sheets

INJECTION LOCKER FREQUENCY DIVIDER

This application claims the benefit of Taiwan application Serial No. 096110002, filed Mar. 22, 2007, the subject matter of which is incorporated herein by reference.

BACKGROUND OF THE INVENTION

1. Field of the Invention

The invention relates in general to an injection locked frequency divider, and more particularly to an injection locked frequency divider having a wider injection locked frequency range.

2. Description of the Related Art

With the progress of the communication industry, a high-frequency phase lock loop (PLL) has been widely applied to various wired and wireless communication systems, such as frequency synthesizers or clock generators. In the high-frequency PLL, a high-frequency frequency divider, which is one of the indispensable components, can receive an original signal and lower the frequency by dividing the frequency of the original signal by one or different values.

An injection locked frequency divider is frequently used in the industry and has the architecture, in which a signal injection unit and a voltage controlled oscillator are combined. In the present technology, only the injection locked frequency divider implemented by a LC tank oscillator exists. However, the LC tank oscillator has the narrower injection locked frequency range. So, it is an important subject of the invention to provide another type of injection locked frequency divider circuit capable of effectively enhancing the injection locked frequency range of the injection locked frequency divider.

SUMMARY OF THE INVENTION

The invention is directed to an injection locked frequency divider capable of effectively improving the drawback of the conventional injection locked frequency divider, which uses a LC tank oscillator and has a narrower injection locked frequency range, so that the injection locked frequency divider substantially has the advantage of the wider injection locked frequency range.

According to the present invention, an injection locked frequency divider including a ring oscillator, a first injection unit and a second injection unit is provided. The ring oscillator includes a first delay cell and a second delay cell, which include differential input terminals and differential output terminals. The differential input terminals and the differential output terminals of the first delay cell are respectively coupled to the differential output terminals and the differential input terminals of the second delay cell. The first injection unit connected between the differential output terminals of the first delay cell receives and injects a first injection signal to the differential output terminals of the first delay cell. The second injection unit connected between the differential output terminals of the second delay cell receives and injects a second injection signal to the differential output terminals of the second delay cell.

The invention will become apparent from the following detailed description of the preferred but non-limiting embodiments. The following description is made with reference to the accompanying drawings.

DETAILED DESCRIPTION OF THE INVENTION

The injection locked frequency divider according to the embodiment has a ring oscillator serving as the main architecture so that the injection locked frequency divider of this embodiment has the wider injection locked frequency range.

First Embodiment

Figure 1:
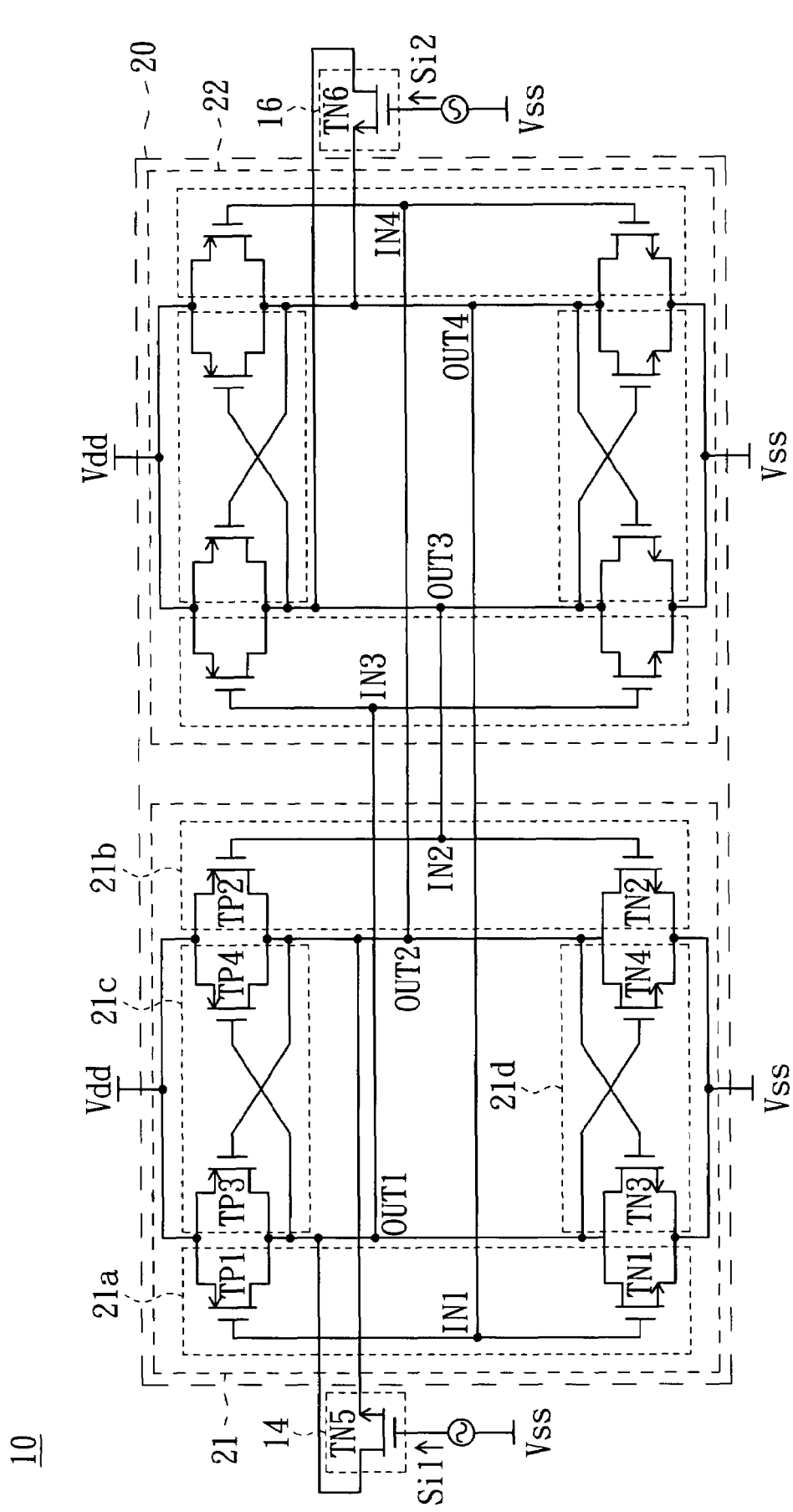
FIG. 1 is a circuit diagram showing an injection locked frequency divider according to a first embodiment of the invention.

FIG. 1 is a circuit diagram showing an injection locked frequency divider 10 according to a first embodiment of the invention. Referring to FIG. 1, the injection locked frequency divider 10 includes injection units 14 and 16 and a ring oscillator 20. In this illustrated embodiment, the injection locked frequency divider 10 and the ring oscillator 20 are differential input output circuits.

The ring oscillator 20 includes two stages of delay cells 21 and 22. The delay cell 21 has differential input terminals IN1 and IN2 and differential output terminals OUT1 and OUT2. The delay cell 22 has differential input terminals IN3 and IN4 and differential output terminals OUT3 and OUT4. The differential input terminals IN1 to IN4 are respectively coupled to the differential output terminals OUT4, OUT3, OUT1 and OUT2 to form the ring oscillator 20. The differential output terminals OUT1, OUT2, OUT3 and OUT4 further output generated signals So1, So2, So3 and So4. The technology associated with the formation of the ring oscillator formed by integrating the delay cells 21 and 22 is well known in the art, so the detailed descriptions thereof are omitted.

The injection unit 14 connected between the differential output terminals OUT1 and OUT2 receives an injection signal Si1 and injects the injection signal Si1 into the delay cell 21. The injection unit 16 connected between the differential output terminals OUT3 and OUT4 receives an injection signal Si2 and injects the injection signal Si2 into the delay cell 22. In this embodiment, the injection signals Si1 and Si2 are differential signals having inverse levels.

The injection signals Si1 and Si2 are coupled to the ring oscillator 20 and frequencies of the injection signals Si1 and Si2 are mixed with a natural frequency of the ring oscillator 20. Then, each of the frequencies of the output signals So1 to So4 is substantially equal to one half of the frequency of each of the injection signals Si1 and Si2. In this embodiment, the injection signals Si1 and Si2 may be sinusoidal signals, and the output signals So1 to So4 are sinusoidal signals each having a doubled period. The phases of the output signals So3, So2 and So4 respectively lead the phase of the output signal So1 by 90, 180 and 270 degrees. Thus, the injection locked frequency divider 10 of this embodiment can effectively generate the output signals So1 to So4 each having the frequency equal to one half of the frequency of the injection signal Si1 so that the injection locked frequency divider 10 of this embodiment substantially has the effect of dividing the frequencies of the injection signals Si1 and Si2 by 2.

The delay cells 21 and 22 have substantially the same circuit structure, for example. In the following, the circuits of the delay cells 21 and 22 will be described by taking the delay cell 21 as an example. The delay cell 21 includes inverter units 21a and 21b and cross latch units 21c and 21d. Input terminals of the inverter units 21a and 21b are respectively coupled to the differential input terminals IN1 and IN2 and receive the signals (i.e., the output signals So4 and So3) of the differential input terminals IN1 and IN2. Output terminals of the inverter units 21a and 21b are respectively coupled to the differential output terminals OUT1 and OUT2. The inverter units 21a and 21b generate the output signals So1 and So2 having levels inverse to those of the output signals So4 and So3 according to the output signals So4 and So3.

The cross latch units 21c and 21d coupled to the first and second inverter units latch the output signals So1 and So2, and speed up the process of converting the voltage level so that each stage of delay can be reduced and the outputting frequency can be increased. In addition, the similar differential effect can be provided by the cross latch so that the sensitivity to the noise is decreased.

The inverter unit 21a includes transistors TP1 and TN1, and the inverter unit 21b includes transistors TP2 and TN2. The transistors TP1 and TP2, such as PMOS transistors, have sources for receiving a voltage Vdd, drains respectively coupled to the differential output terminals OUT1 and OUT2, and gates respectively coupled to the differential input terminals IN1 and IN2 to receive the output signals So4 and So3.

The transistors TN1 and TN2, such as NMOS transistors, have sources for receiving a voltage Vss, drains respectively coupled to the differential output terminals OUT1 and OUT2, and gates respectively coupled to the differential input terminals IN1 and IN2 to receive the output signals So4 and So3. The voltages Vdd and Vss are respectively a highest voltage and a lowest voltage of the injection locked frequency divider 10, for example.

For example, the cross latch unit 21c includes transistors TP3 and TP4, and the cross latch unit 21d includes transistors TN3 and TN4. The transistors TP3 and TP4, such as PMOS transistors, have sources for receiving the voltage Vdd, drains respectively coupled to the output terminals OUT1 and OUT2, and gates respectively coupled to the output terminals OUT2 and OUT1. The transistors TN3 and TN4, such as NMOS transistors, have sources for receiving the voltage Vss, drains respectively coupled to the output terminals OUT1 and OUT2, and gates respectively coupled to the output terminals OUT2 and OUT1. The delay cells 21 and 22 have substantially the same circuit structure and operation, so the circuit structure and operation of the delay cell 22 may be derived according to the descriptions associated with the delay cell 21.

The injection units 14 and 16 respectively include transistors TN5 and TN6, such as NMOS transistors having sources respectively coupled to the differential output terminals OUT2 and OUT4, drains respectively coupled to the differential output terminals OUT1 and OUT3, and gates for respectively receiving the injection signals Si1 and Si2. The transistors TN5 and TN6 respectively respond with the injection signals Si1 and Si2 to switch the circuit relationship between the differential output terminals OUT1 and OUT2 to be on and off, and to switch the circuit relationship between the differential output terminals OUT3 and OUT4 to be on and off so that the frequencies of the injection signals Si1 and Si2 are respectively coupled to the ring oscillator 20.

The injection locked frequency divider of this embodiment has the ring oscillator serving as the main circuit architecture to inject the differential signals into the output terminals of the first and second delay cells in conjunction with the first and second injection units so that the injection locked frequency divider capable of dividing the frequency by 2 is formed. Consequently, the injection locked frequency divider of the embodiment can effectively improve the drawback of the conventional injection locked frequency divider, which uses the LC tank oscillator and has the narrower injection locked frequency, so that the injection locked frequency divider substantially has the advantage of the wider injection locked frequency range.

Second Embodiment

Figure 2:
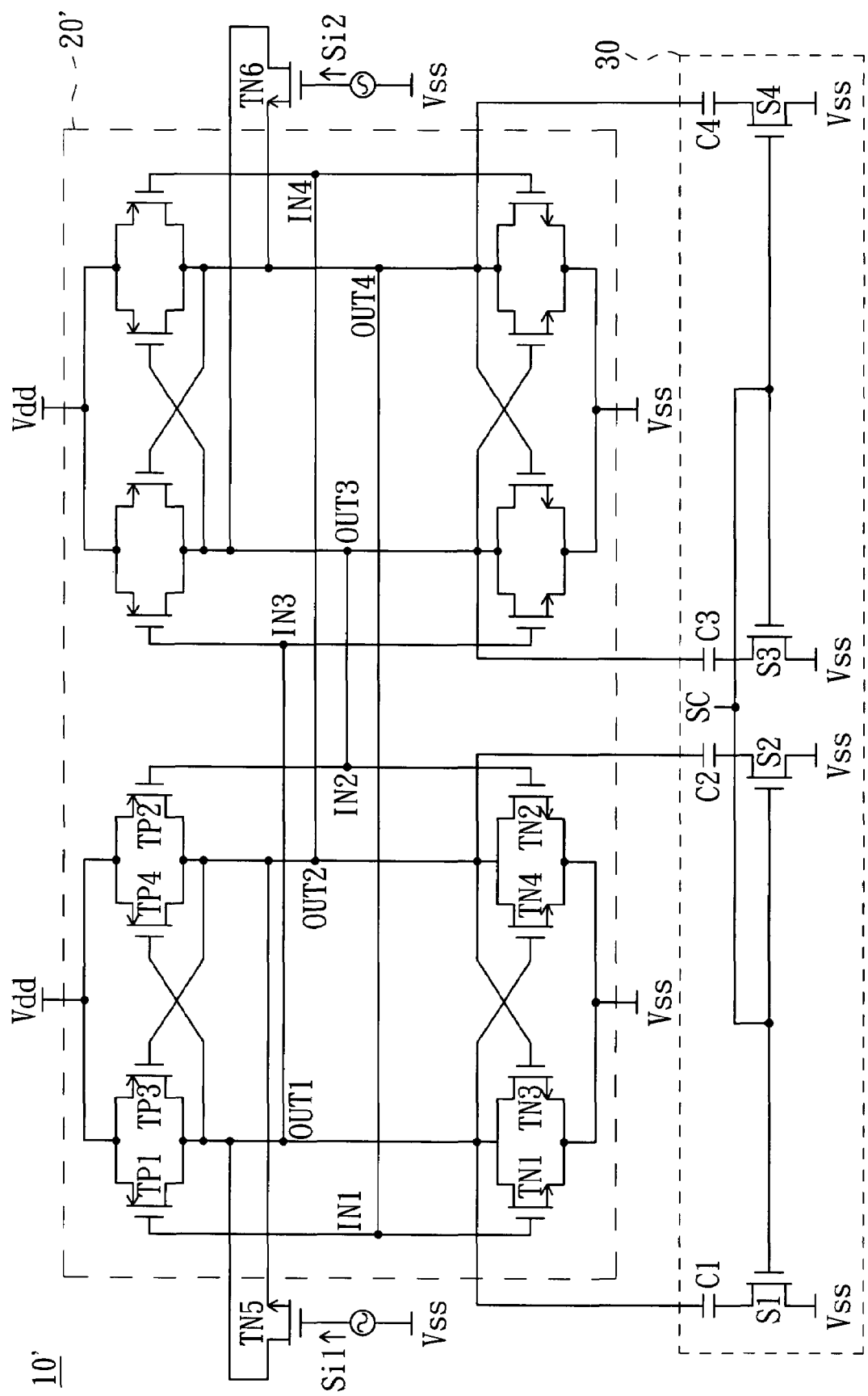
FIG. 2 is a circuit diagram showing an injection locked frequency divider according to a second embodiment of the invention.

FIG. 2 is a circuit diagram showing an injection locked frequency divider 10' according to a second embodiment of the invention. As shown in FIG. 2, the difference between the injection locked frequency divider 10' and the injection locked frequency divider 10 of the first embodiment is that the injection locked frequency divider 10' further has a switching unit 30 for changing the capacitor load of a ring oscillator 20' by switching the switches so that the ring oscillator 20' has two natural frequencies. Consequently, the injection locked frequency divider 10' of this embodiment may be, for example, a dual-band injection locked frequency divider, or may be substantially a single-band injection locked frequency divider having a wide injection locked range because the high band and the low band thereof intersect with each other.

The switching unit 30 has switches S1 to S4 and capacitors C1 to C4. The capacitors C1 to C4 have first terminals respectively coupled to first terminals of the switches S1 to S4, and second terminals respectively coupled to the output terminals OUT1, OUT2, OUT3 and OUT4. Second terminals of the switches S1 to S4 receives the voltage Vss, and the switches S1 to S4 respond with a control signal Sc so that two terminals of each of the switches S1 to S4 are short-circuited or open-circuited. In this illustrated embodiment, the switches S1 to S4 are NMOS transistors.

When the control signal Sc has the low level, the switches S1 to S4 are opened so that the capacitors C1 to C4 and the output terminals OUT1 to OUT4 are respectively opened. At this time, the natural frequency of the ring oscillator 20' is the frequency $f_0$, which satisfies:

$$f_0 = \frac{1}{2\pi} \frac{g_{mn} + g_{mp} + g_{inj}}{C_L},$$

wherein $g_{mn}$, $g_{mp}$ and $g_{inj}$ are respectively the transconductances of the transistors TN1 to TN4, the transistors TP1 to TP4 and the transistors TN5 and TN6, and $C_L$ is the capacitor load of the parasitic capacitor including the transistors TN1 to TN6 and the transistors TP1 to TP4.

When the control signal Sc has the high level, the switches S1 to S4 are closed so that the capacitors C1 to C4 and the output terminals OUT1 to OUT4 are respectively short-circuited. Consequently, the addition of the capacitors C1 to C4 changes the capacitor load and the natural frequency of the ring oscillator 20'. At this time, the natural frequency of the ring oscillator 20' is equal to the frequency $f_0'$ satisfying:

$$f_0' = \frac{1}{2\pi} \frac{g_{mn} + g_{mp} + g_{inj}}{C_L + C_P},$$

wherein $C_p$ is the capacitance of the capacitors C1 to C4.

Figure 3:
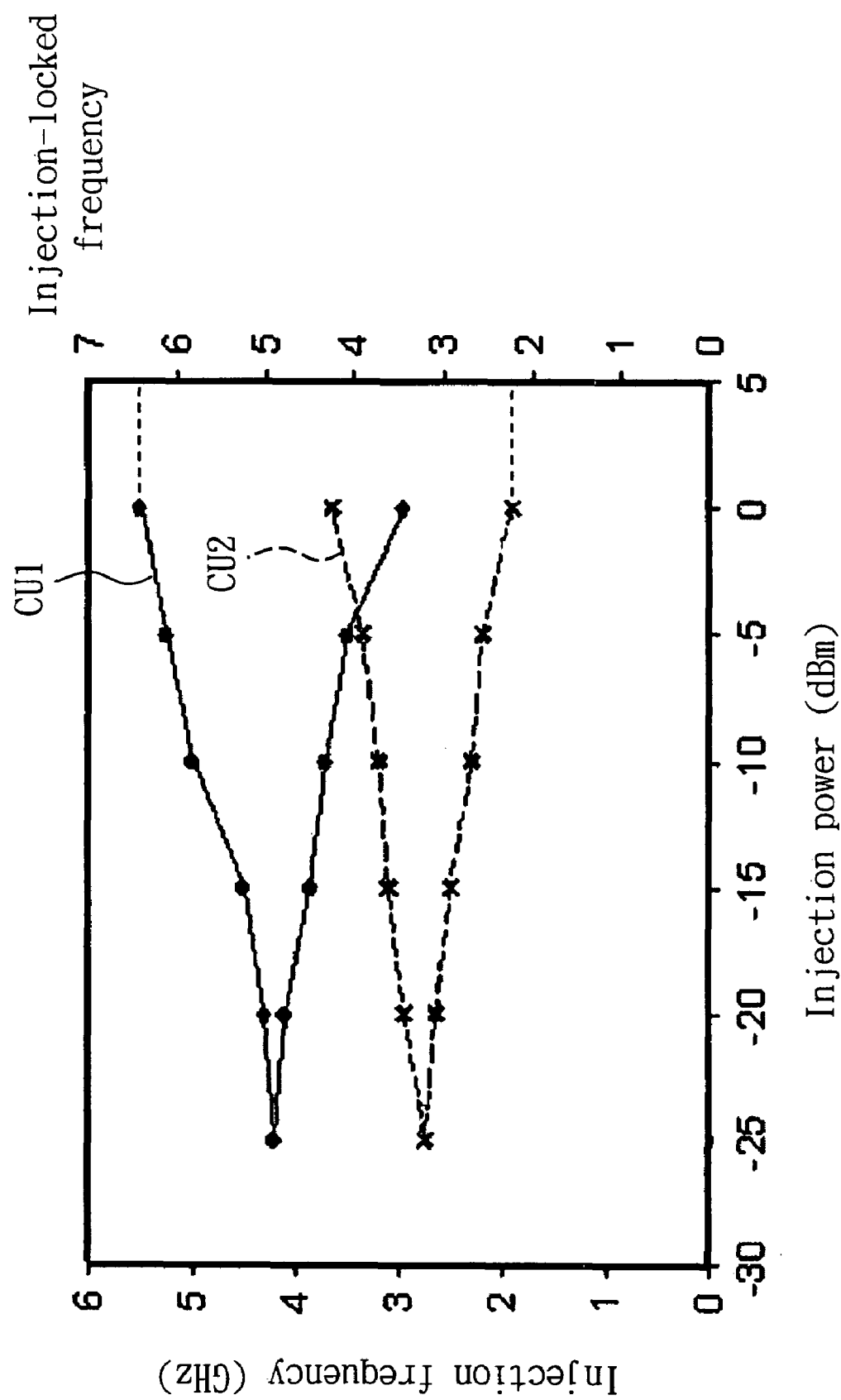
FIG. 3 shows a waveform of an injection locked range of the injection locked frequency divider in FIG. 2.

Thus, the injection locked frequency divider 10' of this embodiment can change the natural frequency of the ring oscillator 20' through the control signal Sc and the switching unit 30, and thus change the frequency range and the injection locked range of the injection locked frequency divider 10'. FIG. 3 shows a waveform of the injection locked range of the injection locked frequency divider in FIG. 2. As shown in FIG. 3, the low frequency and the high frequency in the frequencies $f_0$ and $f_0'$ of this embodiment are 1.36 GHz and 2.3 GHz, respectively, so that the injection locked frequency divider 10' of this embodiment has the high-frequency injection locked range and the low frequency injection locked range. The high-frequency and low-frequency injection locked ranges are respectively from 2.95 GHz to 5.5 GHz and from 1.9 GHz to 3.65 GHz when the power of each of the injection signals Si1 and Si2 is 0 dBm. At this time, the high-frequency and low-frequency injection locked ranges have several overlapped ranges so that the injection locked frequency divider 10' of this embodiment may also be regarded as the injection locked frequency divider having the injection locked range from 1.9 GHz to 5.5 GHz.

Consequently, the user may change the natural frequency of the ring oscillator 20' by the provision of the switching unit 30 so that the injection locked frequency divider 10' has the high-frequency and low-frequency injection locked ranges. The user may further easily make the high-frequency and low-frequency injection locked ranges of the injection locked frequency divider 10' have several overlapped ranges through the circuit design so that the injection locked frequency divider 10' is the single-band injection locked frequency divider substantially having the wider injection locked range and can effectively improve the drawback that the conventional injection locked frequency divider has the narrower injection locked range.

Third Embodiment

Figure 4:
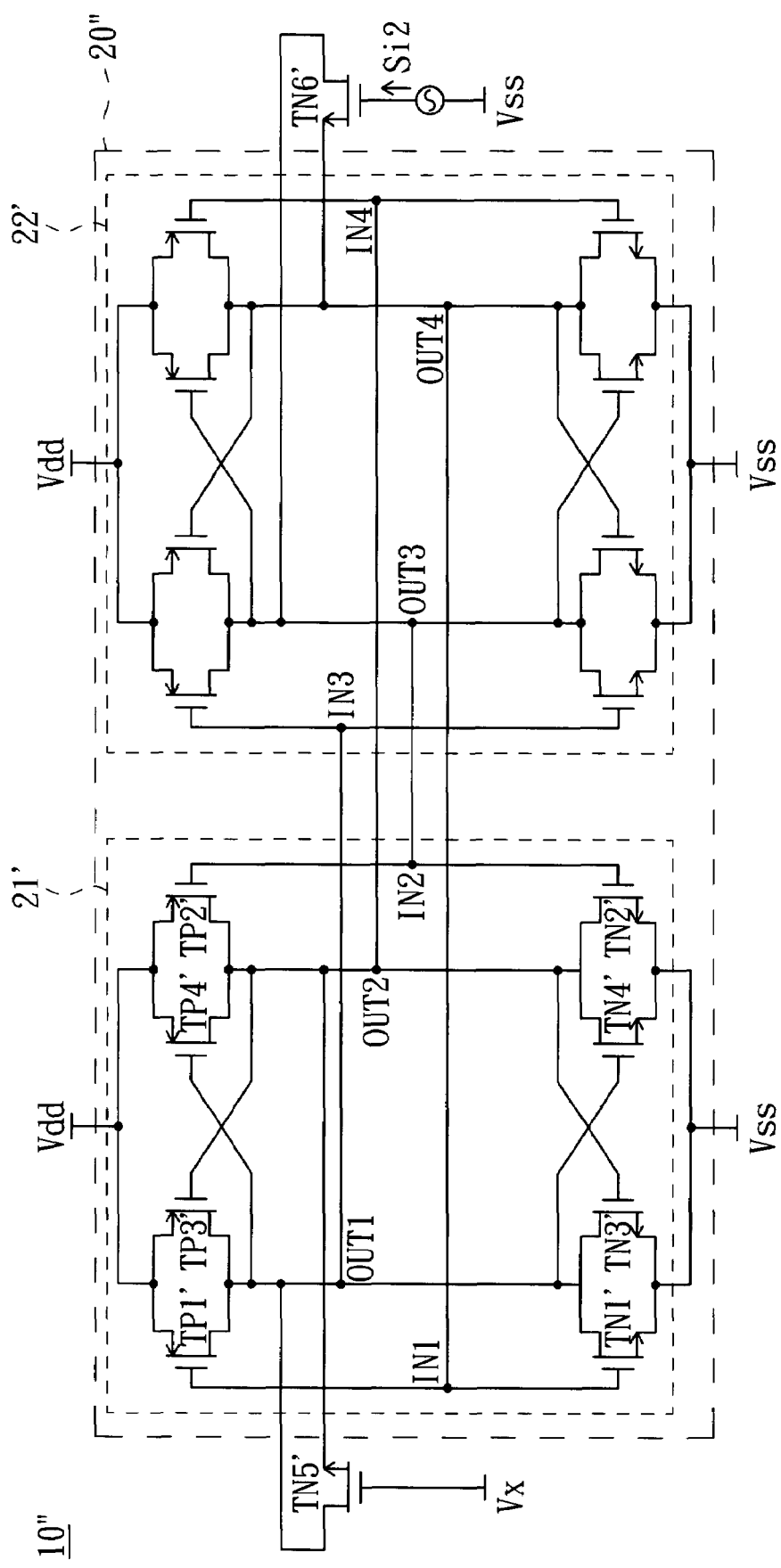
FIG. 4 is a circuit diagram showing an injection locked frequency divider according to a third embodiment of the invention.

FIG. 4 is a circuit diagram showing an injection locked frequency divider according to a third embodiment of the invention. As shown in FIG. 4, the difference between the injection locked frequency divider 10" of this embodiment and the injection locked frequency divider 10 of the first embodiment is that the injection locked frequency divider 10" of this embodiment receives an injection signal Si2' only through a transistor TN6', and no signal is injected into a transistor TN5'. In the first embodiment, the injection signals Si1 and Si2 are symmetrical differential signals, so the delay cells 21 and 22 can generate the output signals So1 and So4 and the output signals So2 and So3 each having the frequency substantially equal to one half of the frequency of the injection signal Si1 due to the linear response.

In this embodiment, however, only the injection signal Si2 is injected, the obvious non-linear response is generated in the delay cells 21' and 22' because the gate-source voltages of the transistors T5' and T6' are not symmetrical. At this time, the frequencies of the output signals So1', So2', So3' and So4' are substantially equal to (1/n) frequency of the injection signal Si2, wherein n is equal to 4, 6 or 8. In this illustrated embodiment, the injection locked frequency divider 10" is a one-fourth frequency divider. In this case, the frequency of each of the output signals So1', So2', So3' and So4' is equal to one fourth of the frequency of the injection signal Si2, and the phase differences between the injection signal Si2 and the output signals So2', So1', So3' and So4' are respectively +0, +180, +90 and +270 degrees, respectively. Consequently, the injection locked frequency divider 10" of this embodiment has the effect of dividing the frequency of the injection signal Si2 by 4.

In this embodiment, the level of the DC voltage Vx is adjustable, and the user may change the amplitudes of the output signals So1' and So2' and the natural frequency of the ring oscillator 20" by adjusting the level of the DC voltage Vx, and adjust the injection locked range of the injection locked frequency divider 10" by adjusting the natural frequency of the ring oscillator 20".

The natural frequency of the ring oscillator 20" and the transfer function of the delay cell 21' relate to the transconductance of the transistor TN5' and the transconductance of the transistor TN5' relates to the level of the voltage Vx. Consequently, when the level of the voltage Vx (i.e., the level of the gate voltage of the transistor TN5') changes, the natural frequency of the ring oscillator 20" and the transfer function of the delay cell 21' correspondingly change. Consequently, the injection locked range of the injection locked frequency divider 10" and the amplitudes of the output signals So1' and So2' correspondingly change.

Figure 5:
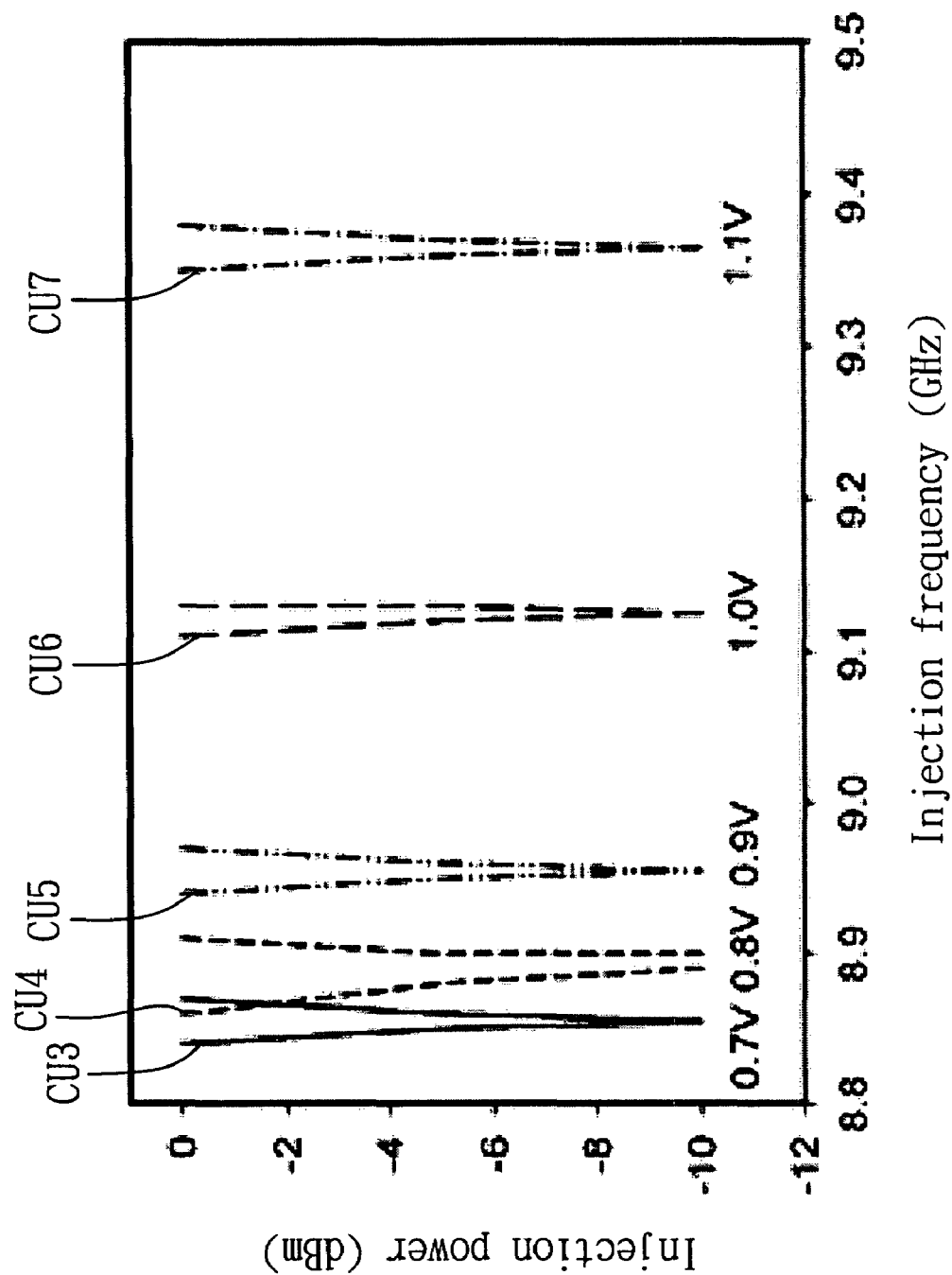
FIG. 5 shows a waveform of an injection locked range of the injection locked frequency divider in FIG. 4.

FIG. 5 shows a waveform of the injection locked range of the injection locked frequency divider in FIG. 4. As shown in FIG. 5, the curves CU3 to CU7 represent the injection locked ranges of the injection locked frequency divider 10" when the voltage Vx is equal to 0.7 volts (V), 0.8V, 0.9V, 1.0V and 1.1V. Consequently, the user can adjust the injection locked range of the injection locked frequency divider 10" by adjusting the level of the voltage Vx of the injection locked frequency divider 10" of this embodiment so that the injection locked frequency divider 10" has the wider injection locked range.

In this illustrated embodiment, the injection signal Si2 is injected and the injection signal Si1 is not injected to damage the linear response of the delay cells 21' and 22' so that the frequency of the injection signal Si2 is divided by 4. However, the injection locked frequency divider 10" of this embodiment is not limited to the use of the injection method to achieve the effect of dividing the frequency by 4. Instead, other injection signals may be injected to damage the linear response of the ring oscillator 20" to achieve the effect of dividing the frequency by 4.

Figure 6:
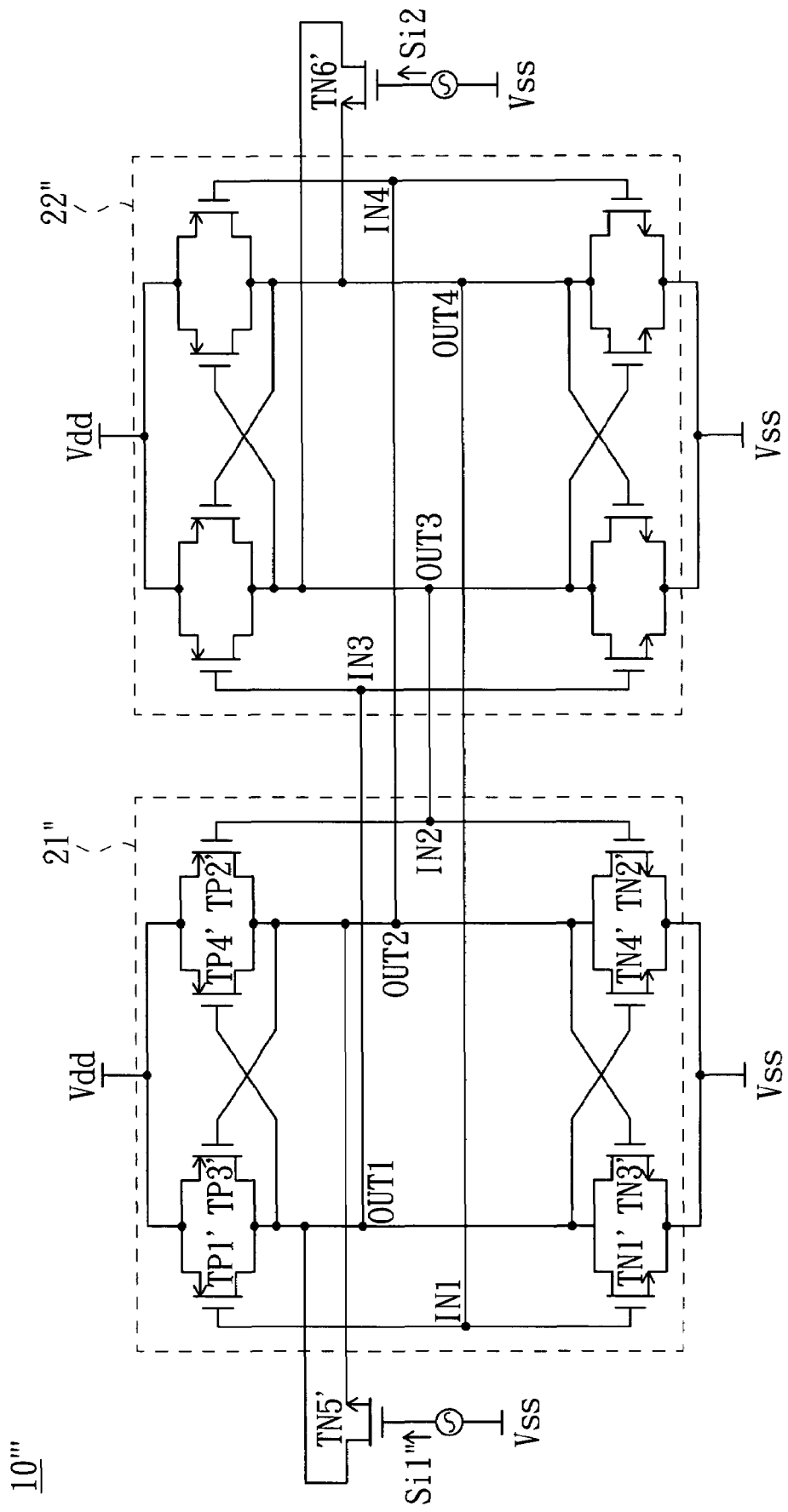
FIG. 6 is another circuit diagram showing the injection locked frequency divider according to the third embodiment of the invention.

For example, the ring oscillator 20" receives the injection signals Si1" and Si2 both having substantially the same phase. Thus, the injection signals Si1" and Si2 may also damage the linear response of the delay cells 21" and 22", as shown in FIG. 6, so that the injection locked frequency divider 10'" has the effect of dividing the frequency by 4. FIG. 6 is another circuit diagram showing an injection locked frequency divider according to the third embodiment of the invention.

The injection locked frequency divider of this embodiment has the ring oscillator serving as the main circuit architecture, and the first and second injection units inject the injection signals capable of damaging the operational symmetry between the first and second delay cells in the ring oscillator so that the injection locked frequency divider capable of dividing the frequency by n is obtained. Consequently, the injection locked frequency divider frequency of this embodiment has the greater divisor and the frequency divisor of the injection locked frequency divider can be advantageously changed by the selection of the injection signal.

In addition, the injection locked frequency divider of this embodiment may further adjust the injection locked range of the injection locked frequency divider by adjusting the DC signal level of the injection signal. Thus, the injection locked frequency divider of this embodiment may advantageously have the wider injection locked frequency range.

Fourth Embodiment

Figure 7:
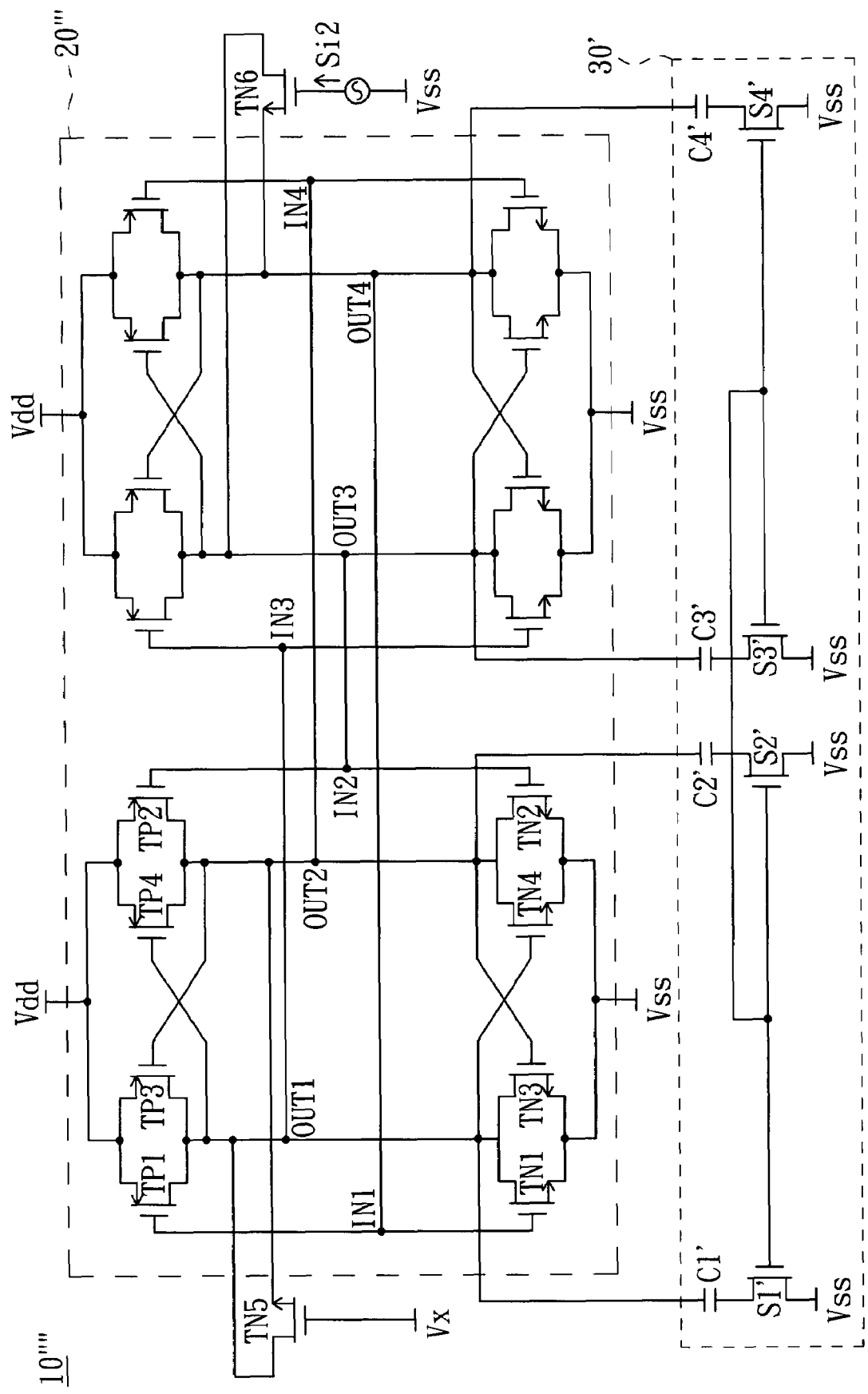
FIG. 7 is a circuit diagram showing an injection locked frequency divider according to a fourth embodiment of the invention.

FIG. 7 is a circuit diagram showing an injection locked frequency divider according to a fourth embodiment of the invention. As shown in FIG. 7, the fourth embodiment is different from that of the third embodiment in that an injection locked frequency divider 10'''' further has a switching unit 30' for changing the capacitor load of a ring oscillator 20''' by switching switches so that two natural frequencies may be obtained. Thus, the injection locked frequency divider 10'''' of this embodiment may be, for example, a dual-band injection locked frequency divider, or may be a single-band injection locked frequency divider substantially having the wider injection locked range because the high band and the low band thereof intersect with each other.

Figure 8:
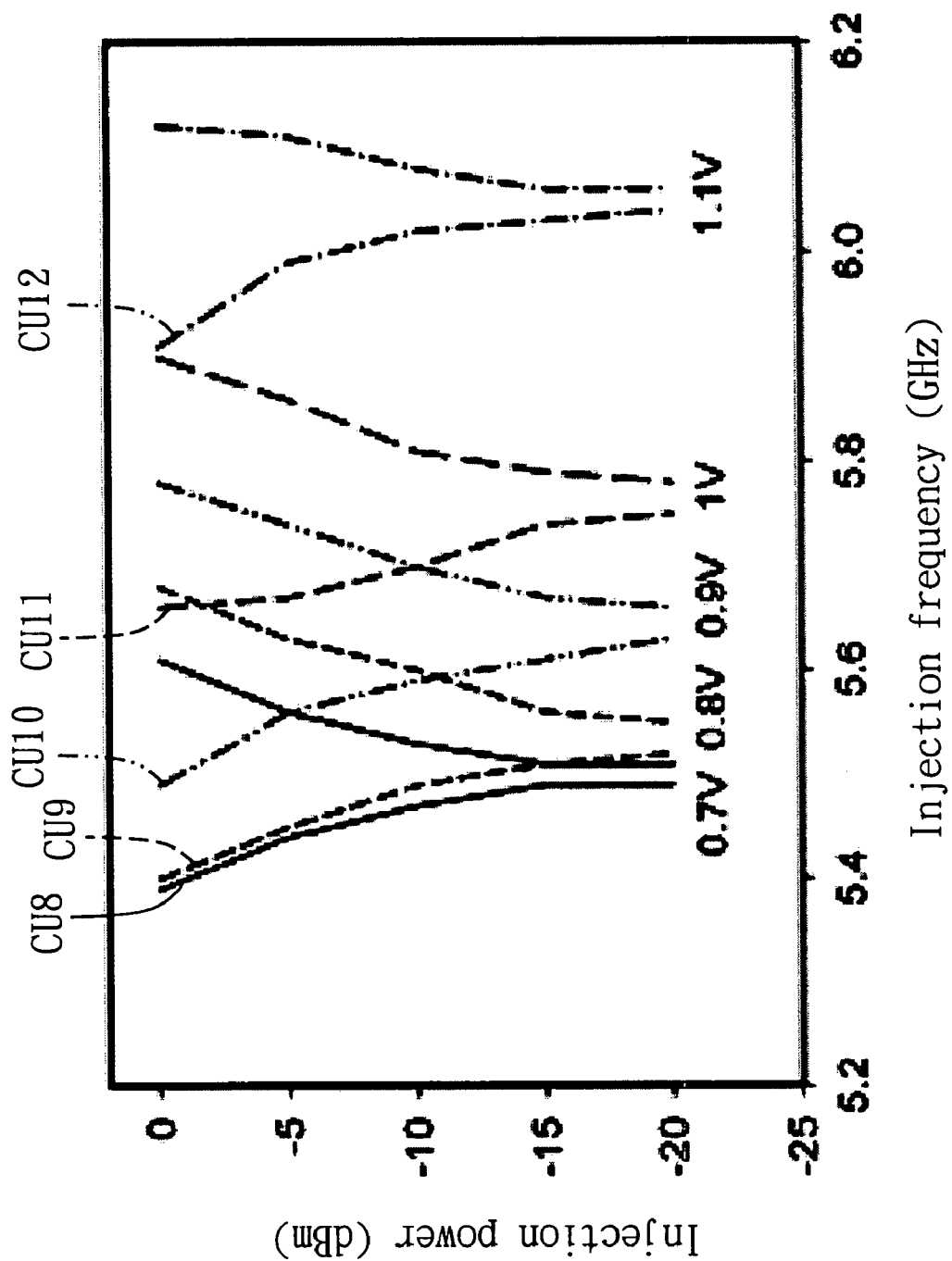
FIG. 8 shows a waveform of a low band injection locked range of the injection locked frequency divider in FIG. 7.

When a control signal Sc' has the low level, the injection locked frequency divider 10'''' and the injection locked frequency divider 10' of the third embodiment have substantially the same injection locked range, for example, as shown in FIG. 5. When the control signal Sc' has the high level, the transistors S1' to S4' turn on. At this time, the injection locked range of the injection locked frequency divider 10'''' is shown in FIG. 8, which shows a waveform of a low band injection locked range of the injection locked frequency divider in FIG. 7, because the natural frequency of the ring oscillator 20''' and the injection locked range of the injection locked frequency divider 10'''' are changed.

Consequently, the injection locked frequency divider of this embodiment also has the greater frequency divisor, and the injection locked frequency divider of this embodiment advantageously has the adjustable frequency divisor through the selection of the injection signal. In addition, the injection locked frequency divider of this embodiment may further adjust the injection locked range of the injection locked frequency divider by adjusting the DC level of the injection signal and the level of the control signal, and thus advantageously has the wider injection locked frequency range.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An injection locked frequency divider, comprising:
    a ring oscillator, which comprises a first delay cell and a second delay cell each comprising differential input terminals and differential output terminals, wherein the differential input terminals and the differential output terminals of the first delay cell are respectively coupled to the differential output terminals and the differential input terminals of the second delay cell;
    a first injection unit, connected between the differential output terminals of the first delay cell, for receiving and injecting a first injection signal to the differential output terminals of the first delay cell; and
    a second injection unit, connected between the differential output terminals of the second delay cell, for receiving and injecting a second injection signal to the differential output terminals of the second delay cell.

2. The divider according to claim 1, wherein when each of the first injection signal and the second injection signal is a differential signal, the differential output terminals of the first or second delay cell output a first frequency-divided signal having a frequency substantially equal to one half of a frequency of the differential signal.

3. The divider according to claim 1, wherein when the first and second injection signals are AC signals substantially equal to each other, the differential output terminals of the first and second delay cells output a second frequency-divided signal having a frequency substantially equal to one fourth of a frequency of each of the first and the second injection signals.

4. The divider according to claim 1, wherein when the first and second injection signals are respectively equal to a first voltage level and an AC signal, the differential output terminals of the first and second delay cells output a second frequency-divided signal having a frequency substantially equal to one fourth of a frequency of the AC signal.

5. The divider according to claim 1, wherein each of the first and second delay cells comprises:
    a first inverter unit and a second inverter unit, having input terminals respectively coupled to the corresponding differential input terminals in the corresponding delay cells, and output terminals respectively coupled to the corresponding differential output terminals in the corresponding delay cells, for generating a first inverted signal and a second inverted signal according to signals of the differential input terminals and outputting the first inverted signal and the second inverted signal to the corresponding differential output terminals; and
    a first cross latch unit, coupled to the first and second inverter units, for latching the first and second inverted signals.

6. The divider according to claim 5, wherein each of the first inverter unit and the second inverter unit comprises:
    a first transistor and a second transistor having first terminals respectively receiving a second voltage level and a third voltage level, second terminals coupled to the corresponding differential output terminals, and control terminals coupled to the corresponding differential input terminals.

7. The divider according to claim 5, wherein the first cross latch unit comprises:
    a third transistor and a fourth transistor having first terminals receiving the second voltage level, second terminals respectively coupled to the corresponding differential output terminals in the corresponding delay cells, and control terminals respectively coupled to the second terminals of the fourth and third transistors.

8. The divider according to claim 5, wherein each of the first and second delay cells further comprises a second cross latch unit for latching the first and second inverted signals, and the second cross latch unit comprises:
    a fifth transistor and a sixth transistor having first terminals receiving the third voltage level, second terminals respectively coupled to the corresponding differential output terminals in the corresponding delay cells, and control terminals respectively coupled to the second terminals of the fourth and third transistors.

9. The divider according to claim 1, wherein the first injection unit comprises:
    a first transistor having a first terminal and a second terminal respectively coupled to the differential output terminals of the first delay cell, and a control terminal receiving the first injection signal.

10. The divider according to claim 1, wherein the second injection unit comprises:
a second transistor having a first terminal and a second terminal respectively coupled to the differential output terminals of the second delay cell, and a control terminal receiving the second injection signal.

11. The divider according to claim 1, further comprising:
a switching unit, coupled to the first and second delay cells, for responding with a selection signal to change a natural frequency of the ring oscillator and thus to change an injection locked frequency range of the injection locked frequency divider.

12. The divider according to claim 1, wherein the switching unit comprises:

a plurality of switches, each having a first terminal and a second terminal, for responding with a selection signal to electrically connect the first terminal to the second terminal, wherein the first terminal of each of the switches receives a third voltage level; and a plurality of capacitors having first terminals respectively coupled to the second terminals of the switches, and second terminals coupled to the differential output terminals of the first and second delay cells, wherein when the switches turn on, the capacitors change natural frequencies of the first and second delay cells and thus change an injection locked frequency range of the injection locked frequency divider.

* * * * *